United States Patent [19]

Hilton et al.

[11] Patent Number: 5,434,446
[45] Date of Patent: Jul. 18, 1995

[54] PARASITIC CAPACITANCE CANCELLATION CIRCUIT

[75] Inventors: Edward B. Hilton, Wayland; Robert A. Duris, Hubbardston, both of Mass.; Douglas W. Babcock, Manchester, N.H.

[73] Assignee: Analog Devices, Inc., Norwood, Mass.

[21] Appl. No.: 287,478

[22] Filed: Aug. 8, 1994

Related U.S. Application Data

[63] Continuation of Ser. No. 88,170, Jul. 7, 1993, abandoned.

[51] Int. Cl.$^6$ ................... H01L 27/12; H01L 27/02
[52] U.S. Cl. ................... 257/503; 257/507; 257/526; 257/593
[58] Field of Search ............... 257/503, 506, 507, 526, 257/577, 593

[56] References Cited

U.S. PATENT DOCUMENTS

| | | | |
|---|---|---|---|
| 4,341,990 | 7/1982 | Davis | 323/303 |
| 4,623,854 | 11/1986 | Kuraishi | 333/173 |
| 5,047,734 | 9/1991 | Newell et al. | 331/46 |
| 5,185,585 | 2/1993 | Newell et al. | 331/46 |

Primary Examiner—Ngân V. Ngô
Attorney, Agent, or Firm—Joseph S. Iandiorio; Kirk Teska

[57] ABSTRACT

A parasitic capacitance cancellation circuit for a direct bonded silicon-on-insulator integrated circuit includes one or more transistors fabricated silicon-on-insulator; a silicon substrate region outside the transistor(s) having a parasitic capacitance to be cancelled; a bootstrap terminal connected to the region outside the transistor(s); and a unity gain buffer responsive to the output of the transistor(s) and having its output connected to the bootstrap terminals for providing a voltage to the region outside the transistor(s) which follows the voltage developed on the parasitic capacitance and nullifies the parasitic capacitance.

3 Claims, 3 Drawing Sheets 5,434,446

PARASITIC CAPACITANCE CANCELLATION CIRCUIT

This is a continuation of application Ser. No. 08/088,170, filed Jul. 7, 1993 now abandoned.

FIELD OF INVENTION

This invention relates to a parasitic capacitance cancellation circuit for a direct bonded silicon-on-insulator integrated circuit.

BACKGROUND OF INVENTION

High speed integrated circuits require ever higher slew rates, i.e., the rate of change of voltage in order to attain higher overall speed of operation. The slew rates are a function of current and parasitic capacitance. Thus speed can be increased by increasing the current up to the power dissipation limits of the system. Or the speed can be increased by deceasing the parasitic capacitance of the system. This latter option, while the preferred approach, is conventionally perceived as a function of the size of the components and distances between them: the smaller the circuits, the lower the parasitic capacitance.

SUMMARY OF INVENTION

It is therefore an object of this invention to provide an improved, higher speed integrated circuit.

It is a further object of this invention to provide such an improved, silicon-on-insulator integrated circuit which provides increased speed without increased current or reduced size.

It is a further object of this invention to provide such an improved, silicon-on-insulator integrated circuit which provides increased speed by cancelling or nullifying the effects of parasitic capacitance.

It is a further object of this invention to provide such an improved, higher speed integrated circuit which is uniquely suited to fabrication in direct bonded silicon-on-insulator integrated circuits.

The invention results from the realization that a higher speed silicon-on-insulator integrated circuit can be achieved by using a unit gain buffer driven by the output of the one or more transistors whose speed is to be increased to feed back a booster voltage to the silicon substrate region outside that transistor or transistors to compel the other terminal parasitic capacitance associated with that region to follow the transistor(s) output and thus cancel the effects of the parasitic capacitance.

This invention features a parasitic capacitance cancellation circuit for a direct bonded silicon-on-insulator integrated circuit. There are one or more transistors and a silicon substrate region outside the transistors having a parasitic capacitance to be cancelled. A bootstrap terminal is connected to the region outside the transistor or transistors. There is a unity gain buffer responsive to the output of the transistor or transistors with its output connected to the bootstrap terminal for providing a voltage to the region outside the transistor or transistors which follows the voltage developed on the parasitic capacitance and nullifies the parasitic capacitance.

In a preferred embodiment the parasitic capacitance includes the metal to substrate parasitic capacitance and the side wall of the transistor parasitic capacitance.

DISCLOSURE OF PREFERRED EMBODIMENT

Other objects, features and advantages will occur to those skilled in the art from the following description of a preferred embodiment and the accompanying drawings, in which.

Figure 1:
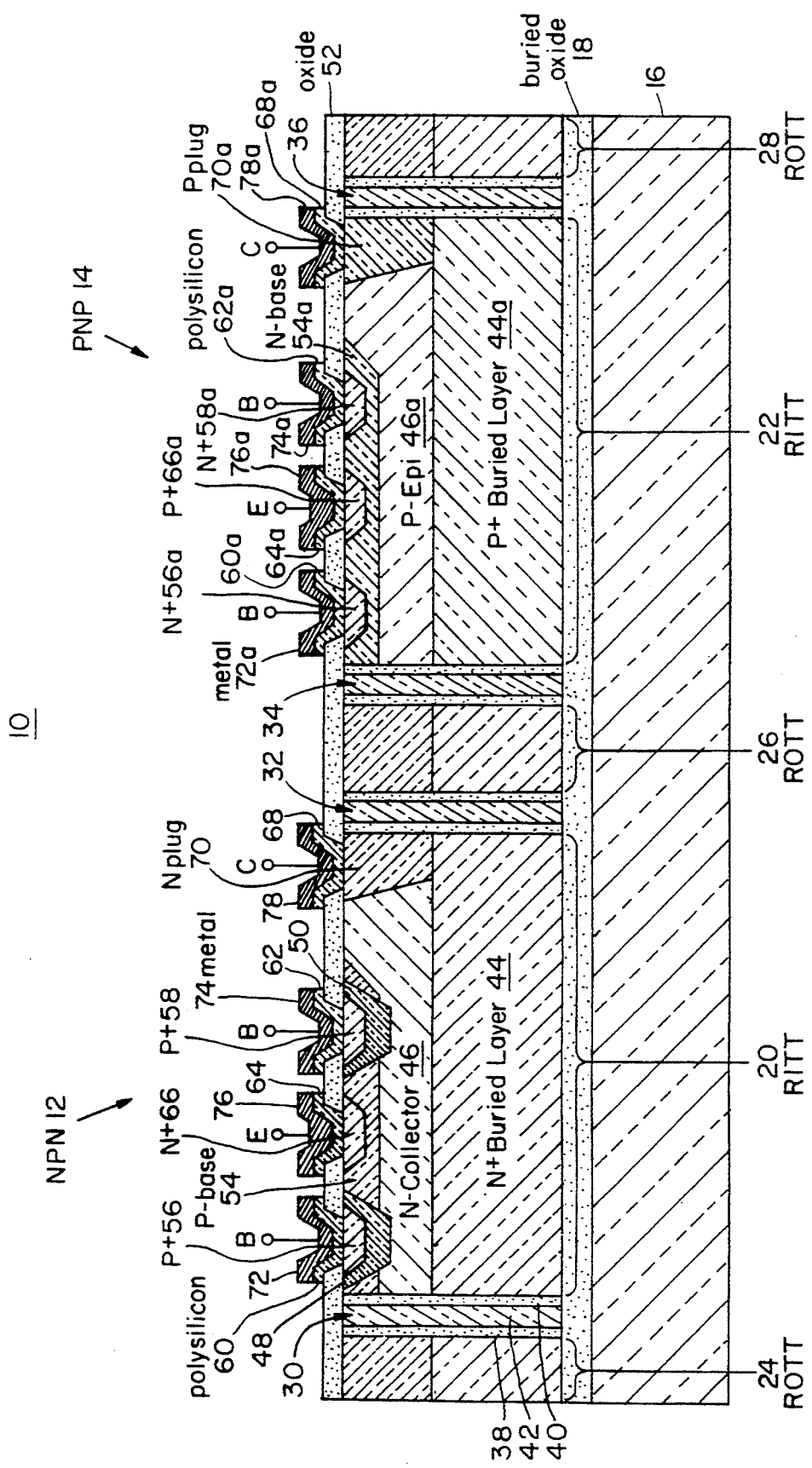
FIG. 1 is a side schematic cross-sectional view of a prior art direct bonded silicon-on-insulator integrated circuit.

There is shown in FIG. 1 a direct bonded silicon-on-insulator integrated circuit 10 including a pair of transistors, NPN transistor 12 and PNP transistor 14, forming a part of an integrated circuit mounted on the silicon handle substrate 16. On top of handle substrate 16 is an insulator layer, buried oxide 18. On top of buried oxide insulator layer 18 are the Regions Inside The Trench (RITT) 20 and 22 and the Regions Outside The Trench (ROTT) 24, 26, and 28. These are so called because they are either inside, RITT, or outside, ROTT, the vertical insulating trenches 30, 32, 34, and 36. Each of these trenches includes, as indicated specifically with respect to trench 30, a pair of spaced oxide layers 38 and 40 containing a polysilicon medium 42 between them.

In RITT 20 transistor 12 includes the heavily doped N+ buried layer 44 and the end collector layer 46. Protruding into the end collector layer 46 are the base plugs 48 and 50 which extend from the top oxide insulator layer 52 through the P base layer 54. Also included in transistor 12 are the P+ regions 56 and 58 which interface with the base contact 60 and 62. Emitter contact 64 interfaces with N+ region 66 and collector contact 68 interfaces with N plug 70 that interconnects with the N+ buried layer 44. Base metal contacts 72 and 74 are disposed on polysilicon contacts 60 and 62. Emitter metal contact 76 is disposed on emitter polysilicon contact 64 and metal collector contact 78 is disposed on polysilicon 68.

PNP transistor 14 is constructed similarly to NPN transistor 12 except that there are no base plugs 48 and 50 and the various regions are reversed. That is, where they are shown as P+ regions in transistor 12, they are N+ regions in transistor 14, and vice versa. Like parts have been given like numbers associated by a lower case a in the reference numerals associated with PNP transistor 14 with respect to NPN transistor 12.

Figure 2:
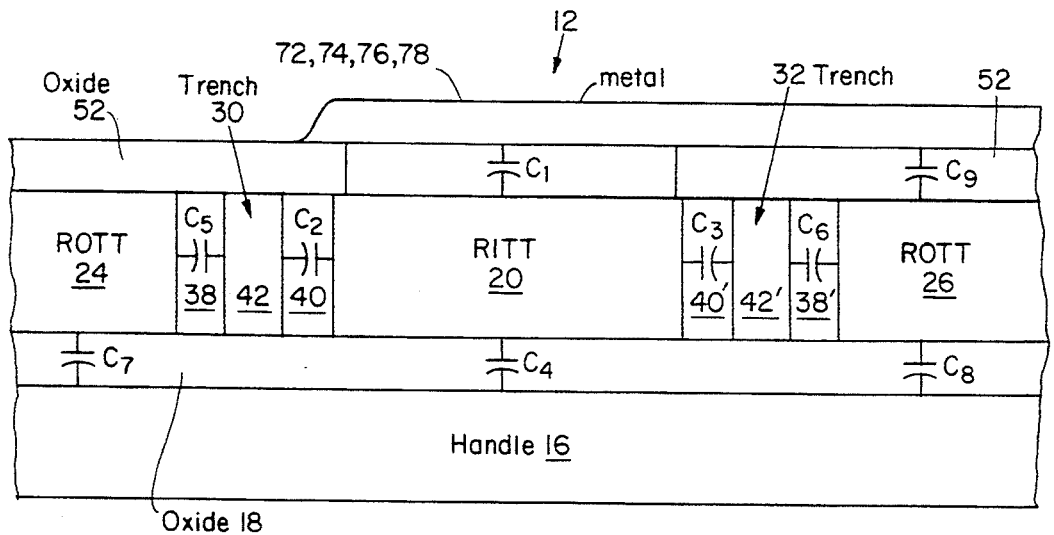
FIG. 2 is a schematic equivalent circuit showing the capacitances that occur in the circuit of FIG. 1.

The parasitic capacitance associated with the transistor, such as transistors 12 and 14, is shown in more detail in FIG. 2 with respect to NPN transistor 12 where the metal conductor, conductors 72, 74, 76, and 78, are shown simply as a single run of conductor, once again mounted on insulator oxide layer 52. Also in FIG. 2 trench 32 has been shown having the same construction as that of trench 30, called out by the same numbers accompanied by a prime, namely 38' 40', and 42'. The parasitic capacitance associated with each are indicated as capacitances $C_1$–$C_9$. $C_1$ is the capacitance between the metal conductor and the RITT 20. $C_2$ is the capacitance of inner trench wall 40. $C_3$ is the capacitance of inner trench wall 40'. Capacitance $C_4$ represents the capacitance between RITT 20 and handle 16. Capacitances $C_5$ and $C_6$ are the capacitances relative to the outer walls 38 and 38' of trenches 30 and 32. $C_7$ and $C_8$ represent the capacitances between the ROTT areas 24 and 26 and handle 16. The capacitance $C_9$ is the metal to ROTT capacitance between the metal conductor 72, 74, 76, and 78, and the region outside the trench ROTT 26 or ROTT 24.

In accordance with this invention, it was realized that while the capacitances cannot be reduced, the effect of some of them can be cancelled: the parasitic metal capacitance $C_9$ and the side wall or trench capacitances $C_5$, $C_2$ and $C_3$, $C_6$ can be effectively cancelled by applying a booster voltage to the silicon substrate regions 24, 26 outside the transistors. The capacitances $C_2$–$C_6$ as a group are often referred to as $C_{JS}$. This invention addresses the cancellation of the parasitic metal capacitance $C_9$ as well as the side wall capacitances $C_5$, $C_2$, $C_3$ and $C_6$, but not the capacitance $C_4$, and across insulator 18 between the handle layer 16 and the silicon of the ROTT and RITT layer above it.

One application of this invention is in pin driver circuits utilized by computerized integrated circuit testing equipment to provide high slew rates in the neighborhood of 3 volts per nanosecond so that the rise rate of the voltages from the test circuit will exceed the capacity of the circuits being tested and in this way insure that the device under test is the limiting factor rather than the drive circuits themselves.

Figure 3:
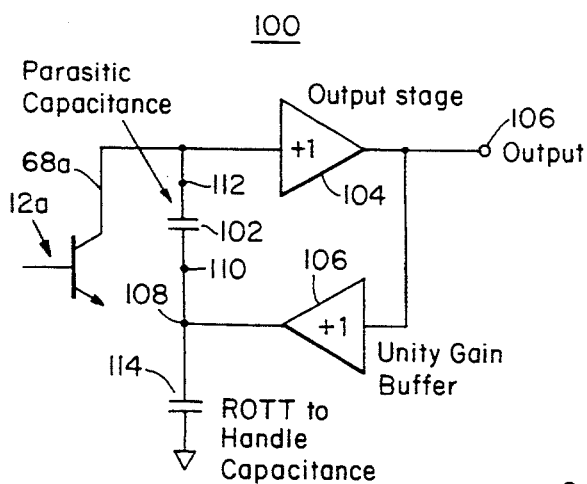
FIG. 3 is a schematic diagram of a pin driver circuit using the parasitic capacitance cancellation circuit of this invention.

One such pin driver circuit 100, FIG. 3, includes the transistor, transistor 12a for example, whose parasitic capacitance, both the sidewall capacitance and the metal capacitance, is represented by capacitor 102. The collector 68a of transistor 12a drives output stage 104 which is a unity gain amplifier whose output 106 is the pin driver output. In accordance with this invention the output of amplifier 104 is fed back through a second unity gain amplifier 106 to a terminal 108 which is the region outside the trench ROTT 24, 26. Unity gain amplifier 106 causes terminal 108 to provide a voltage on the other terminal 110 of capacitor 102 so that it follows precisely the voltage on terminal 112 of capacitor 102 which is connected to the collector 68a of transistor 12a. Since the voltages on both sides of the capacitor move together, the capacitance is effectively invisible or cancelled with respect to the transistor 12a circuit. The remaining capacitance, namely the RITT to handle capacitance $C_4$, and represented here by capacitor 115, is not so cancelled. The ROTT to handle capacitance $C_7$ and $C_8$, represented by capacitor 114, remains a parasitic capacitance whose capacity determines the current required to be produced by unity amplifier 106.

Figure 4:
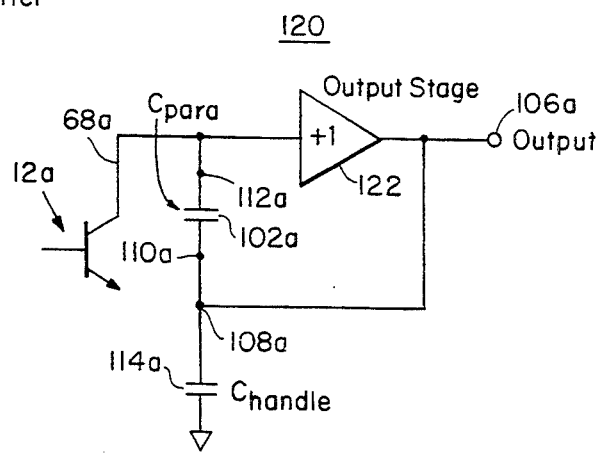
FIG. 4 is a schematic diagram of a conventional operational amplifier using the parasitic capacitance cancellation circuit of this invention.

While the specific embodiment in FIG. 3 including a pin driver employs a separate unity buffer 106, this is not a necessary limitation of the invention. For example, in a more conventional operational amplifier circuit 120, FIG. 4, when a nominal output stage 122 itself has a unity gain then the output of that amplifier itself can be used to feed back and drive terminal 108a to cause the other terminal 110a of capacitor 102a to follow precisely the voltage on the first terminal 112a of capacitor 102a. If in such a case the output stage amplifier 122 happened to be greater than one, a unity gained buffer would simply be added to the circuit and connected between the capacitor terminals 112a and 110a. In either case the unity gain buffer offers a low impedance output to drive the silicon substrate region. Although in the specific embodiment shown here the transistor 12a is shown as a single transistor component, actually there may be tens of transistors served by buffer 106 or 122.

Figure 5:
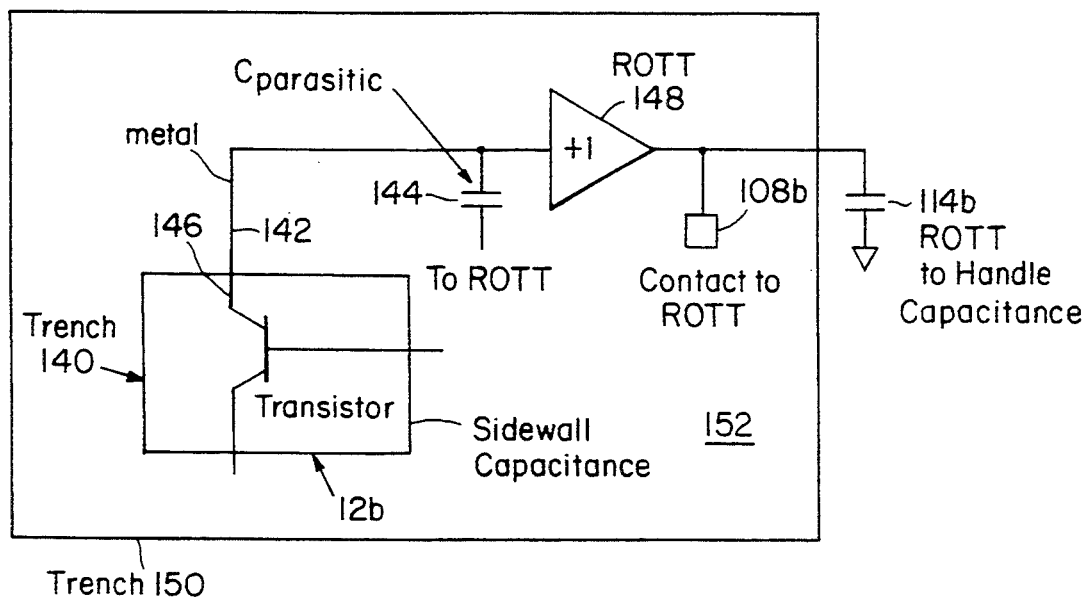
FIG. 5 is a schematic plan view of a simplified circuit fabricated with the parasitic capacitance cancellation circuit of this invention.

The fabrication of a simple circuit according to this invention associated with a single transistor is shown in FIG. 5, where transistor 12b is disposed within a trench 140 that has associated with it a certain sidewall capacitance as previously referred to. The metal 142 which gives rise to the parasitic metal capacitance 144 extends to the collector 146 of transistor 12b in unity gain amplifier 148. A larger trench 150 surrounds the entire assembly and the output from buffer 148 is connected to a contact such as contact 108b, which is directly connected to the region outside the trench ROTT 152. Again, the ROTT-to-handle capacitance 114b is not cancelled by the feedback from buffer 148 to ROTT 152.

Although specific features of this invention are shown in some drawings and not others, this is for convenience only as some feature may be combined with any or all of the other features in accordance with the invention.

Other embodiments will occur to those skilled in the art and are within the following claims:

What is claimed is:

1. A parasitic capacitance cancellation circuit for a direct bonded silicon-on-insulator integrated circuit comprising:

transistor means having an output and including at least one transistor fabricated silicon-on-insulator a silicon substrate region outside the transistor means having a parasitic capacitance to be cancelled;

a bootstrap terminal connected to said region outside the transistor means; and a unity gain buffer, responsive to the output of said transistor means and having its output connected to said boot strap terminal for providing a voltage to said region outside the transistor means which follows the voltage developed on the parasitic capacitance thereby nullifying the parasitic capacitance.

2. The parasitic capacitance cancellation circuit of claim 1 in which the parasitic capacitance includes the metal to substrate parasitic capacitance.

3. The parasitic capacitance cancellation circuit of claim 1 in which the parasitic capacitance includes sidewall to transistor means parasitic capacitance.

* * * * *